(12) United States Patent
Akita

(10) Patent No.: US 7,550,776 B2
(45) Date of Patent: Jun. 23, 2009

(54) LIGHT GENERATING SEMICONDUCTOR DEVICE AND METHOD OF MAKING THE SAME

(75) Inventor: Katsushi Akita, Itami (JP)

(73) Assignee: Sumitomo Electric Industries, Ltd., Osaka (JP)

( * ) Notice: Subject to any disclaimer, the term of this patent is extended or adjusted under 35 U.S.C. 154(b) by 0 days.

(21) Appl. No.: 12/071,440

(22) Filed: Feb. 21, 2008

(65) Prior Publication Data

US 2008/0149954 A1 Jun. 26, 2008

Related U.S. Application Data

(62) Division of application No. 10/911,653, filed on Aug. 5, 2004, now Pat. No. 7,368,310.

(30) Foreign Application Priority Data

| Aug. 8, 2003 | (JP) | ............................ P2003-290308 |
| Jun. 9, 2004 | (JP) | ............................ P2004-171301 |

(51) Int. Cl.
*H01L 33/00* (2006.01)

(52) U.S. Cl. .......................... 257/96; 257/98; 257/103; 257/E33.034; 257/E33.068

(58) Field of Classification Search ................ 257/96, 257/98, 103, E33.034, E33.068
See application file for complete search history.

(56) References Cited

U.S. PATENT DOCUMENTS

| 6,552,376 | B1 | 4/2003 | Koike et al. |
| 6,744,071 | B2 | 6/2004 | Sano et al. |
| 7,049,635 | B2 | 5/2006 | Sano et al. |
| 2002/0155634 | A1 | 10/2002 | D'Evelyn et al. |
| 2002/0166502 | A1 | 11/2002 | Vaudo et al. |
| 2003/0089906 | A1 | 5/2003 | Ueda |
| 2003/0141506 | A1 | 7/2003 | Sano et al. |

FOREIGN PATENT DOCUMENTS

| JP | 11-68157 | 3/1999 |
| JP | 2001-060720 A | 3/2001 |
| JP | 2001-77423 | 3/2001 |
| JP | 2001-119104 | 4/2001 |
| JP | 2001-148544 A | 5/2001 |

(Continued)

OTHER PUBLICATIONS

Japanese Office Action issued in Japanese Patent Application No. JP 2004-171301 dated on Jun. 3, 2008.

(Continued)

*Primary Examiner*—Minh-Loan T Tran
(74) *Attorney, Agent, or Firm*—McDermott Will & Emery LLP

(57) ABSTRACT

In a method of making a semiconductor light generating device, a GaN-based semiconductor portion is formed on a GaN or AlGaN substrate. The GaN-based semiconductor portion includes a light generating film. An electrode film is formed on the GaN-based semiconductor film. A conductive substrate is bonded to a surface of the electrode film using a conductive adhesive. After bonding the conductive substrate, the GaN or AlGaN substrate is separated from the GaN-based semiconductor portion to form the semiconductor light generating device.

5 Claims, 16 Drawing Sheets

FOREIGN PATENT DOCUMENTS

| | | |
|---|---|---|
| JP | 2003-100705 A | 4/2003 |
| JP | 2003-218470 | 7/2003 |
| JP | 2003-37286 | 2/2008 |
| WO | WO 02/19439 A1 | 3/2002 |
| WO | WO 03-054937 A1 | 7/2003 |

OTHER PUBLICATIONS

D. Morita, et al. "High Output Power 365 nm Ultraviolet Light Emitting Diode of GaN-Free Structure" Jpn. J. Appl. Phys. vol. 41 (2002), Part 2, No. 12B, pp. L1434-L1436.

D. Morita, et al. "Effect of Low-threading-dislocation-density GaN-Template on 365 nm UV-LED" 50th Conference of Japan Society of Applied Physics Extended Abstract, pp. 431.

Japanese Office Action for Corresponding Appl. No. 2004-171301 Dispatched Feb. 6, 2007.

Chinese Office Action issued in corresponding Chinese Patent Application No. 200410056340.2, dated May 11, 2007.

Japanese Notice of Allowance issued in Japanese Patent Application No. JP 2004-171301 dated on Oct. 21, 2008.

EP Communication dated Dec. 5, 2008, issued in EP Appln. No. 04018710.6-2222.

Daisuke Morita et al., "High Output Power 365 nm Ultraviolet Light Emitting Diode of GaN-Free Structure", XP-001162409, Jpn. J. Appl. Phys. vol. 41 (2002) pp. L1434-L14.36.

Shin-ichi Nagahama et al., "High-Power and Long-Lifetime in GaN Multi-Quantum-Well Laser Diodes Grown on Low-Dislocation-Density GaN Substrates", XP-000977881, Jpn J. Appl. Phys. vol. 39 (2000) pp. L647-L650.

R. Gaska et al., Stimulated Emission at 258 nm In AlN/AlGaN Quantum Wells Grown on Bulk AlN Substrates, XP008044981, Mat. Res. Soc. Symp. Proc. vol. 764, 2003, Materials Research Society, C6.9.1-C6.9.5.

LIGHT GENERATING SEMICONDUCTOR DEVICE AND METHOD OF MAKING THE SAME

Related Applications

This application is a Divisional of U.S. application Ser. No. 10/911,653, filed Aug. 5, 2004, now U.S. Pat. No. 7,368,310, claiming priority of Japanese Application Nos. 2003-290308, filed Aug. 8, 2003, and 2004-171301, filed Jun. 9, 2004, the entire contents of each of which are hereby incorporated by reference.

BACKGROUND OF THE INVENTION

1. Field of the Invention

This invention relates to a semiconductor light generating device for the generation of ultraviolet light and so on, and relates to a method of making the ultraviolet light generating semiconductor device.

2. Related Background Art

Publication 1 (Jpn. J. Appl. Phys. Vol. 41 (2002) pp. L1434-1436) and Publication 2 ($50^{th}$ Conference of Japan Society of Applied Physics, Extended Abstract, pp. 431) disclose semiconductor light generating devices. These semiconductor light generating devices include a Cu—W substrate and a semiconductor structure for light emitting diodes (LEDs). This light emitting diode semiconductor structure has an active layer of an InGaN multiple quantum structure. A Au—Sn layer is formed on the Cu—W substrate. The active layer in the light emitting diode semiconductor structure is provided between a p-electrode for p-type semiconductor and an n-electrode for n-type semiconductor. The semiconductor light generating devices are fabricated in the following steps. A GaN buffer layer and a semiconductor structure for the light emitting diode are sequentially formed on a sapphire substrate by an MOVPE or ELO method. The p-electrode is evaporated on one side of the light emitting diode semiconductor structure and the p-electrode is bonded to the Cu—W substrate using Au—Sn solder. The sapphire substrate is removed by a laser lift-off (LLO) method using KrF excimer laser, and the remaining GaN buffer layer is removed by polishing it with a chemical mechanical polishing (CMP) method. The n-electrode is formed on the polished surface to form the semiconductor light generating devices.

SUMMARY OF THE INVENTION

The present inventors have found a technical problem on semiconductor light generating devices, such as the light emitting diode (LED). Since the semiconductor light generating devices use a sapphire substrate for making the above semiconductor structure for LEDs, the density of threading dislocations in the active layer is high. The semiconductor light generating device in the Publication 1 has the density of threading dislocations, $1.0 \times 10^9$ per square centimeters ($cm^{-2}$), and the semiconductor light generating device in the Publication 2 has a relatively low density of threading dislocations, $1.0 \times 10^7$ per square centimeters ($cm^{-2}$). The threading dislocations reduce the efficiency of light generation in these semiconductor light generating devices.

There is a demand for short wavelength light generating devices, and AlGaN is available for active layers in these short wavelength light generating devices. Since the efficiency of light generation in the AlGaN light emitting devices is sensitive to threading dislocations in the active layers and the density of threading dislocations in AlGaN semiconductor light generating devices using sapphire substrate is high, these devices do not provide desired light emitting characteristics.

It is an object of the present invention to provide a light generating semiconductor device with a high optical power efficiency, and a method of making the light generating semiconductor device.

One aspect of the present invention is a method of making a semiconductor light generating device. This method comprises the steps of: forming a GaN-based semiconductor portion on a $Al_xGa_{1-x}N$ ($0 \leq x \leq 1$) substrate, the GaN-based semiconductor portion including a light generating film; forming an electrode film on the GaN-based semiconductor portion; bonding a conductive substrate to a surface of the electrode film using a conductive adhesive; and after bonding the conductive substrate, separating one of the $Al_xGa_{1-x}N$ substrate and the GaN-based semiconductor portion from the other.

Preferably, the $Al_xGa_{1-x}N$ substrate is a GaN substrate.

In one example of the present invention, the conductive substrate is made of metal.

The method according to the present invention further comprises the step of: prior to forming the GaN-based semiconductor portion, forming a sacrificial film on the GaN substrate, the sacrificial film being made of a first material, the first material having a band gap smaller than the material of the substrate. Separating one of the GaN substrate and the GaN-based semiconductor film from the other includes a step of irradiating the sacrificial film with light to perform lift-off of one of the GaN substrate and the GaN-based semiconductor portion from the other. The light includes a component of a wavelength corresponding to an energy smaller than a bandgap energy of GaN semiconductor.

In the method according to the present invention, the sacrificial film is made of nitride compound semiconductor containing indium.

In the method according to the present invention, the light generating film is made of material having a bandgap energy greater than that of GaN semiconductor.

The method according to the present invention further comprises the steps of: reconditioning the separated GaN substrate for reuse; and performing the following steps using the reconditioned GaN substrate: forming a GaN-based semiconductor portion on the reconditioned GaN substrate, the GaN-based semiconductor portion including a light generating film; forming an electrode film on the GaN-based semiconductor portion; bonding a conductive substrate to a surface of the electrode film; and after bonding the conductive substrate, separating one of the reconditioned GaN substrate and the GaN-based semiconductor portion from the other.

Preferably, the $Al_xGa_{1-x}N$ substrate ($0 \leq x \leq 1$) is an $Al_xGa_{1-x}N$ substrate ($0 \leq x \leq 1$).

In one example of the present invention, the conductive substrate is made of metal.

In the method according to the present invention, the conductive substrate is made of metal.

The method according to the present invention comprises the step of: prior to forming the GaN-based semiconductor portion, forming a sacrificial film on the $Al_xGa_{1-x}N$ substrate, the sacrificial layer being made of a first material, the first material having a bandgap smaller than material of the $Al_xGa_{1-x}N$ substrate. Separating one of the $Al_xGa_{1-x}N$ substrate and the GaN-based semiconductor portion from the other includes a step of irradiating the sacrificial film with light to perform lift-off of one of the $Al_xGa_{1-x}N$ substrate and the GaN-based semiconductor portion from the other. The light includes a wavelength component corresponding to a energy smaller than a bandgap energy of material of the substrate.

In the method according to the present invention, the sacrificial layer is made of nitride compound semiconductor containing indium.

The method according to the present invention further comprises the steps of: reconditioning the separated $Al_xGa_{1-x}N$ substrate for reuse; and performing the following steps using the reconditioned $Al_xGa_{1-x}N$ substrate: forming a GaN-based semiconductor portion on the reconditioned $Al_xGa_{1-x}N$ substrate, the GaN-based semiconductor portion including a light generating film; forming an electrode film on the GaN-based semiconductor portion; bonding a conductive substrate to a surface of the electrode film; and after bonding the conductive substrate, separating one of the reconditioned $Al_xGa_{1-x}N$ substrate and the GaN-based semiconductor portion from the other.

In the method according to the present invention, the light generating layer is made of material having a bandgap energy greater than material of the substrate. In this method, although light from the light generating layer has a short wavelength and is not absorbed by the substrate, the efficiency of light output is enhanced by use of the conductive substrate in place of the substrate on which the GaN-based semiconductor layers have been grown.

In the method according to the present invention, the light generating film is made of nitride compound semiconductor containing aluminum.

In the method according to the present invention, the conductive substrate is made of one of Cu—W alloy and Fe—Ni alloy.

In the method according to the present invention, the conductive adhesive contains one of Au—Sn solder and Pb—Ni solder.

In the method according to the present invention, the electrode film is made of material having a reflectivity greater than the conductive substrate at a peak wavelength of light from the light generating layer.

According to another aspect of the present invention, a semiconductor light generating device comprises: a GaN-based semiconductor portion including a light generating layer, the light generating layer having a density of threading dislocations smaller than $1 \times 10^7$ cm$^{-2}$; an electrode provided on the GaN-based semiconductor portion; a conductive substrate bonded to a surface of the electrode by a conductive adhesive.

In the semiconductor light generating device according to the present invention, the light generating layer is made of a GaN-based semiconductor having a bandgap energy greater than GaN semiconductor.

In the semiconductor light generating device according to the present invention, the light generating layer is made of a semiconductor material of a bandgap energy greater than $Al_xGa_{1-x}N$ ($0 \leq x \leq 1$).

In the semiconductor light generating device according to the present invention, the electrode is made of material having a reflectivity greater than the conductive substrate at a peak wavelength of light from the light generating layer.

In the semiconductor light generating device according to the present invention, the light generating layer is made of a nitride-based compound semiconductor containing aluminum.

BRIEF DESCRIPTION OF THE DRAWINGS

The foregoing and other objects, features and advantages of the invention will become more readily apparent from the following detailed description of a preferred embodiment of the invention, which proceeds with reference to the accompanying drawings.

DESCRIPTION OF THE PREFERRED EMBODIMENTS

Figure 1:
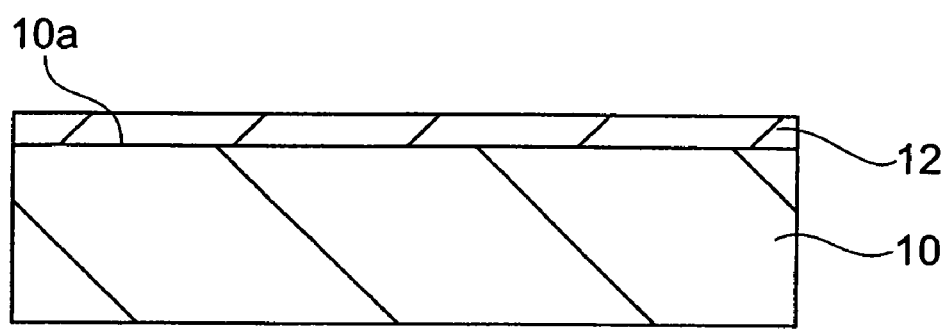
FIG. 1 is a view showing the formation of a buffer layer on a GaN substrate.

The invention is best understood from the following detailed description when read in connection with the accompanying drawing. It is emphasized that, according to common practice, the various features of the drawings are not to scale. On the contrary, the dimensions of the various features are arbitrarily expanded or reduced for clarity. To facilitate understanding, identical reference numerals have been used, where possible, to designate identical elements that are common to the figures.

First Embodiment

With reference to FIGS. 1 to 5, a semiconductor light generating device, such as a semiconductor light emitting diode 1, and a method of making the same according to the first embodiment of the present invention will be described.

Referring to FIG. 1, a GaN substrate 10 is prepared. For example, the GaN substrate 10 may be made of GaN single crystal. The GaN substrate 10 is placed in the MOCVD apparatus (not shown) and the temperature of the GaN substrate 10 is increased to a temperature of 1050 degrees Celsius to carry out the thermal cleaning of the surface 10a of the GaN substrate 10. The thermal cleaning removes contaminants on the surface 10a and improves the evenness of the surface 10a. After the thermal cleaning, a gas including trimethylgallium (TMG) of a III group element source, ammonia ($NH_3$) of a V group element source and silane ($SiH_4$) of a doping element source are supplied to the MOCVD apparatus to form an n-type GaN buffer layer 12 on the surface 10a of the GaN substrate 10. For example, the epitaxial growth temperature is 1050 degrees Celsius. For example, the thickness of the GaN buffer layer 12 is 0.5 micrometers.

Figure 2:
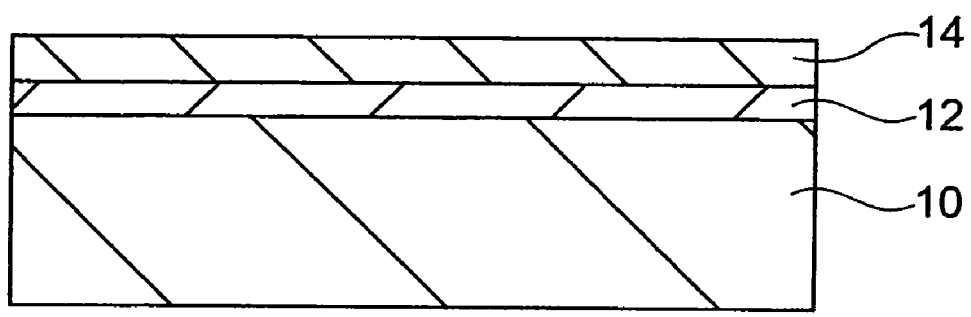
FIG. 2 is a view showing the formation of an InGaN layer on the GaN buffer layer.

The temperature of the GaN substrate 10 is decreased to 800 degrees Celsius, and a gas including TMG and trimethylindium (TMI) of III group element sources and $NH_3$ of a V group element source are supplied to the MOCVD apparatus to form an $In_XGa_{1-X}N$ layer 14 on the GaN buffer 12, as shown in FIG. 2. For example, the composition X of the $In_XGa_{1-X}N$ buffer layer 14 is 0.15 and the thickness of the $In_XGa_{1-X}N$ buffer layer 12 is 50 nanometers.

Figure 3:
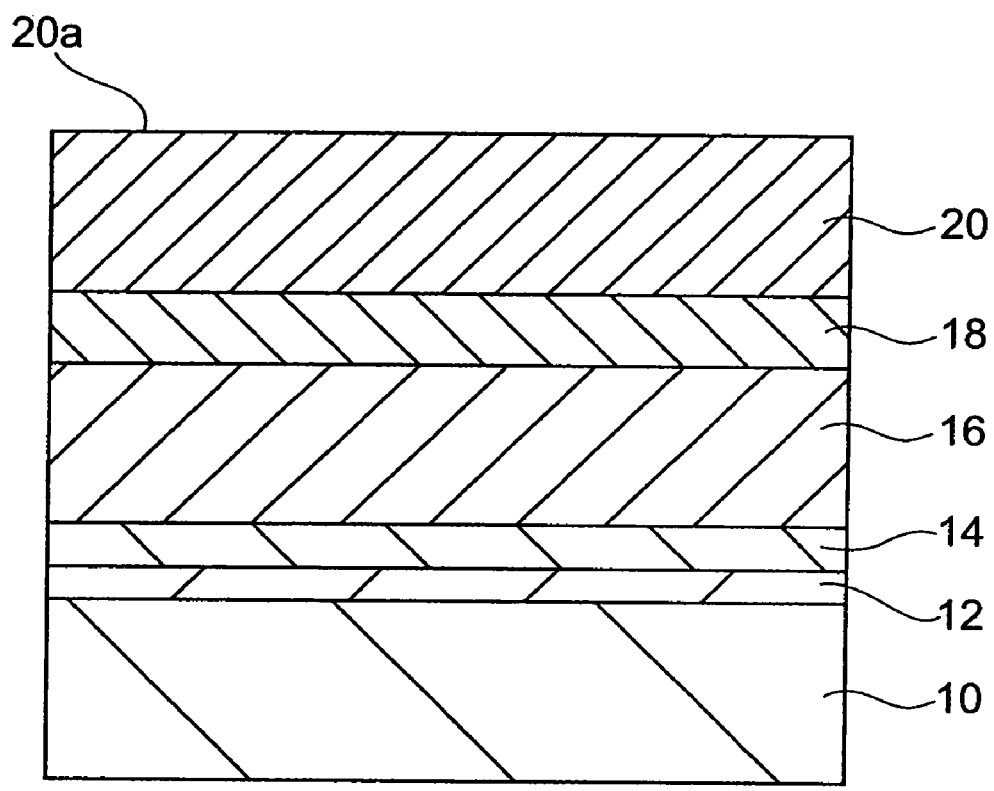
FIG. 3 is a view showing the formation of AlGaN layers on the InGaN sacrificial layer.

The formation of GaN-based layers will be described with reference to FIG. 3. The temperature of the substrate 10 is increased to 1100 degrees Celsius, and a gas including TMG and TMA of III group element sources, $NH_3$ of a V group element source and $SiH_4$ of a doping element source are supplied to the MOCVD apparatus to form an n-type $Al_YGa_{1-Y}N$ (0<y<1) layer 16 on the InGaN layer 14, as shown in FIG. 3. For example, the composition Y of the n-type $Al_YGa_{1-Y}N$ layer 16 is 0.5 and the thickness of the $Al_YGa_{1-Y}N$ layer 16 is 0.2 micrometers. Then, the formation of the remaining GaN-based layers will be described with reference to FIG. 3. A gas including TMG and TMA of III group element sources and $NH_3$ of a V group element source are supplied to the MOCVD apparatus to form an $Al_ZGa_{1-Z}N$ light generating layer 18 (0<z<1) on the AlGaN layer 16 without changing the substrate temperature. This gas may contain $SiH_4$ of a doping element source. For example, the composition Z of the $Al_ZGa_{1-Z}N$ light generating layer 18 is 0.05 and the thickness of the $Al_ZGa_{1-Z}N$ layer 18 is 0.1 micrometers. The substrate temperature remains unchanged, and a gas including TMG and TMA of III group element sources, $NH_3$ of a V group element source and $Cp_2Mg$ of a doping element source are supplied to the MOCVD apparatus to form a p-type $Al_UGa_{1-U}N$ layer 20 (0<U<1) on the light generating AlGaN layer 18. For example, the composition U of the $Al_UGa_{1-U}N$ layer 20 is 0.1 and the thickness of the $Al_UGa_{1-U}N$ layer 20 is 0.2 micrometers. As descried above, a GaN-based semiconductor structure, such as an AlGaN semiconductor structure including the AlGaN layers 16, 18 and 20, is provided on the GaN substrate 10. As shown in FIG. 3, the GaN buffer layer 12 and the InGaN layer 14 are located between the GaN-based semiconductor structure and the GaN substrate 10.

Figure 4:
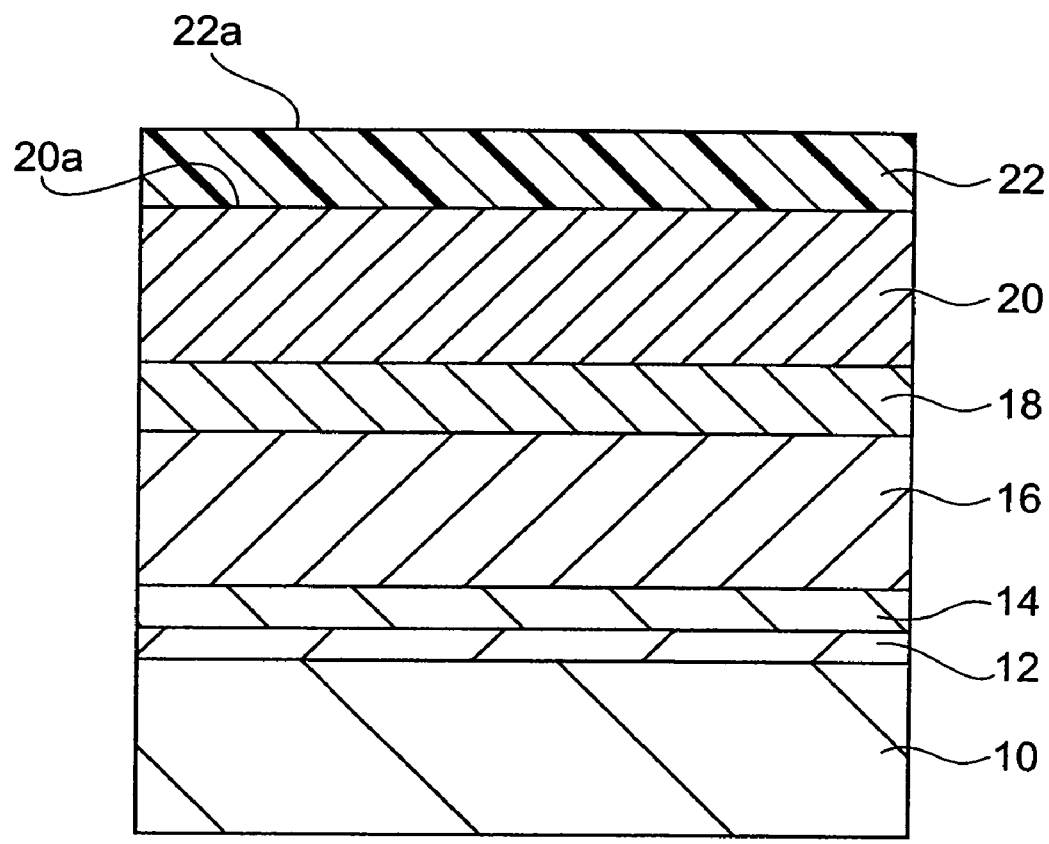
FIG. 4 is a view showing the formation of a p-electrode film on the GaN-based semiconductor layer.
Figure 5:
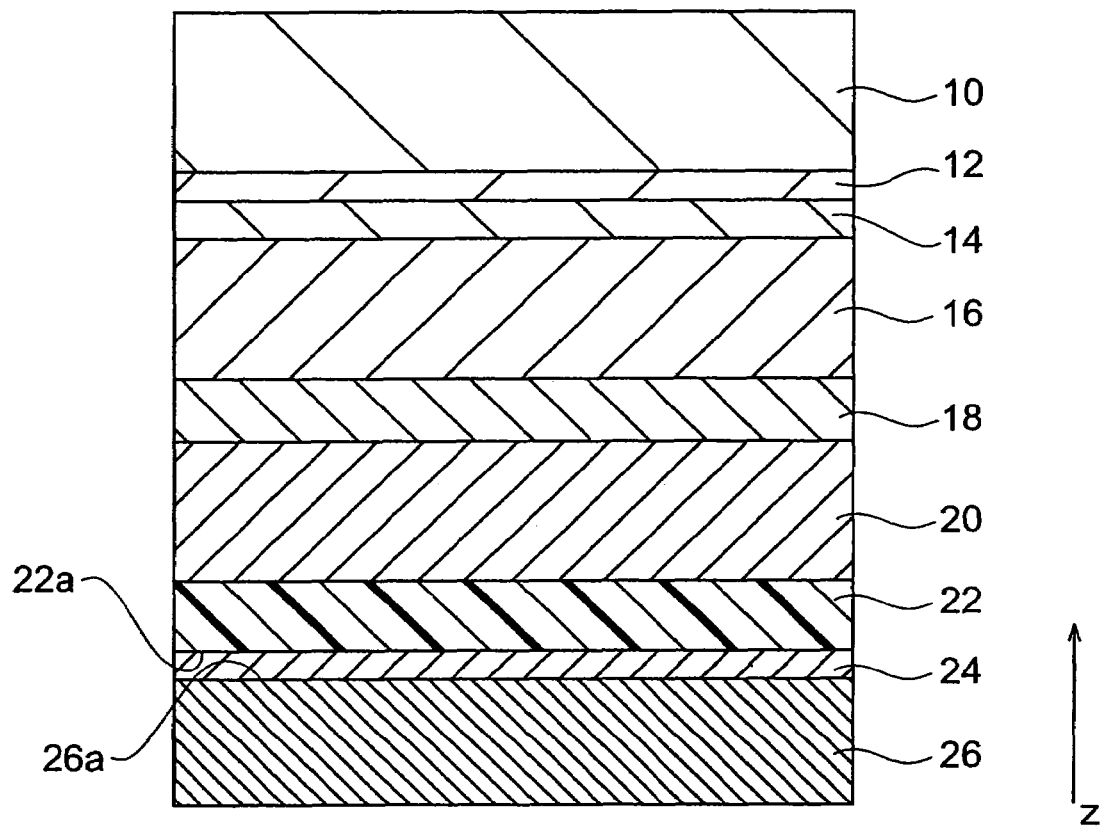
FIG. 5 is a view showing the bonding of the electrode film to a conductive substrate.

Thereafter, the GaN substrate and the epitaxial layers formed thereon, i.e., the epitaxial substrate, is taken out from the MOCVD apparatus, and this epitaxial substrate is placed in the metal deposition apparatus to deposit a p-electrode film 22 of Ag on the surface 20a of the p-type AlGaN layer 20, as shown in FIG. 4. The p-electrode film is heated at the temperature of 400 degrees Celsius for five minutes. It is preferable that the p-electrode film 22 cover the whole surface 20a of the p-type AlGaN layer 20. After the substrate 10 with the p-electrode film is taken out from the metal deposition apparatus, the p-electrode film 22 is bonded to a metal substrate, such as a Cu—W alloy substrate 26, by use of a conductive adhesive, such as Au—Sn solder layer 24. As shown in FIG. 5, the surface 22a of the p-electrode film 22 is bonded to the surface 26a of the Cu—W alloy substrate 26. The semiconductor substrate and layers 10, 12, 14, 16, 18 and 20 and the Cu—W alloy substrate 26 are integrated with each other to form a single member.

Figure 6:
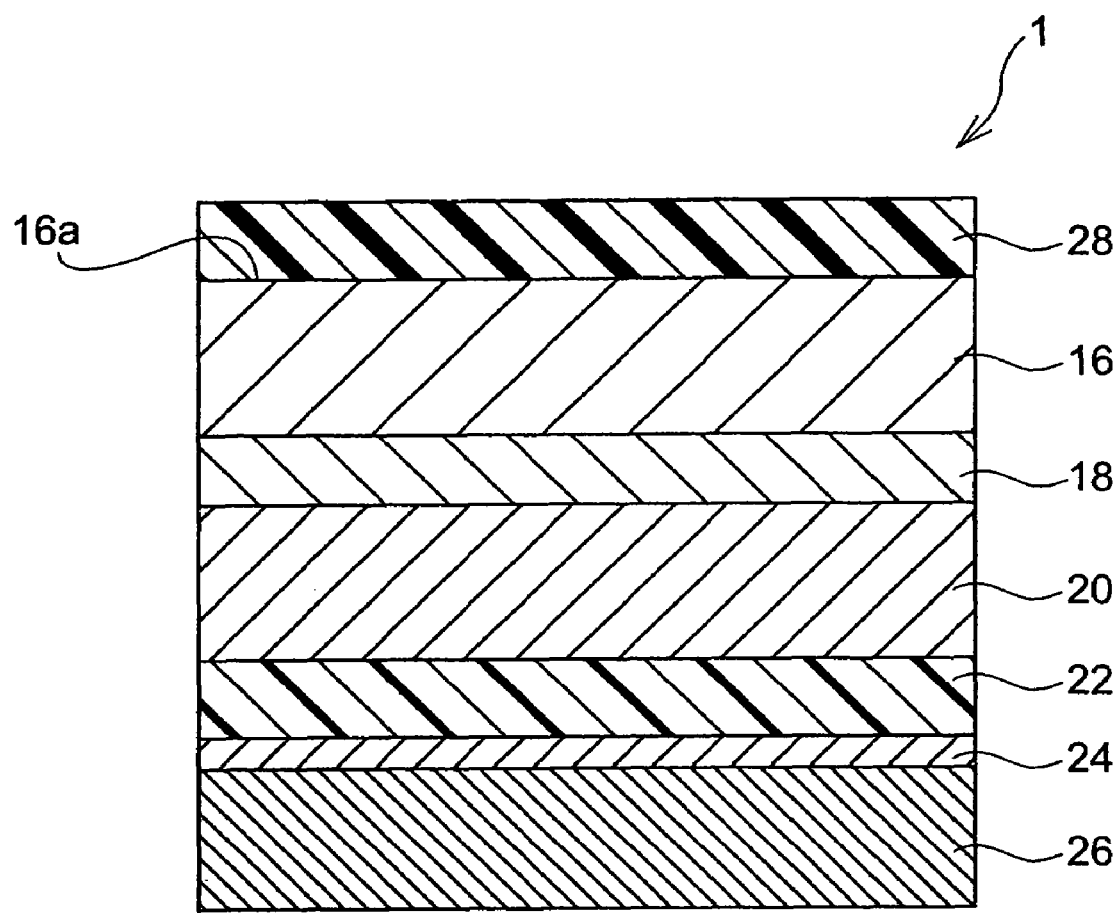
FIG. 6 is a view showing a light generating device.
Figure 13:
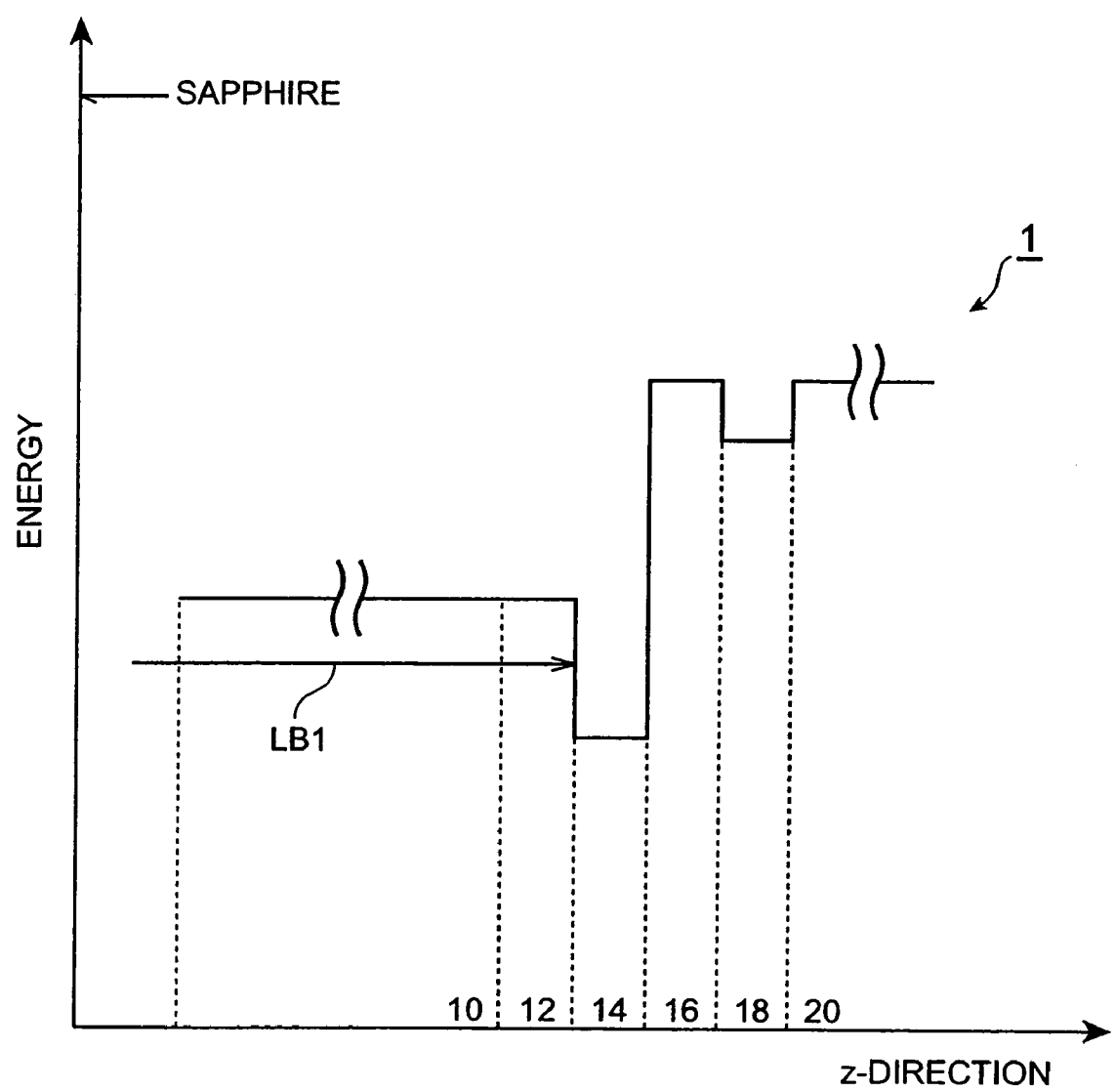
FIG. 13 is a view showing the irradiation of a laser beam to the substrate.
Figure 14:
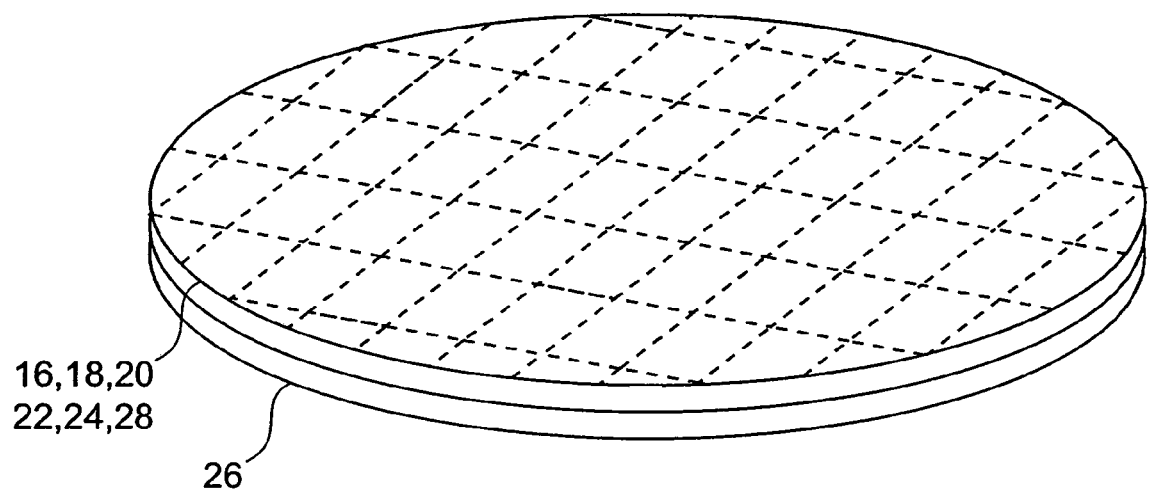
FIG. 14 is a view showing the division of the substrate product into semiconductor dies.

As shown in FIG. 13, a laser beam LB1 having the wavelength of 400 nanometers is irradiated to the backside of the GaN substrate 10. The irradiated light passes through the GaN substrate 10 and is absorbed by the InGaN layer 14. The irradiation of the laser light modifies the InGaN layer 14 and the modified InGaN layer weakens bonding force between the InGaN layer 14 and the GaN buffer layer 12 to separate one of the GaN substrate 10 and the InGaN layer 14 from the other. The surface exposed by this separation is polished to create the surface 16a of the n-type AlGaN layer 16. Then, an n-electrode film is formed on the polished surface 16a in a similar film formation method to the above p-electrode. Thereafter, as shown in FIG. 14, the semiconductor layers 16, 18 and 20, p-electrode and conductive substrate are cut by dicing saw or the like to form semiconductor dies each of which is the light emitting diode 1 as shown in FIG. 6. As a result of the above steps, the light emitting diode according to the first embodiment has been fabricated.

As described above, after the Cu—W alloy substrate 26 is bonded to the AlGaN-based semiconductor structure including the AlGaN layers 16, 18 and 20, the GaN substrate 10 used to deposit the AlGaN layers 16, 18 and 20 is lifted off from the AlGaN layers 16, 18 and 20. Cu—W alloy has a small thermal resistance and thus the Cu—W alloy substrate 26 prevents the optical output of the light emitting diode 1 from saturating in a high current injection.

The inventors have made diligent studies on the optical power efficiency, and have found that the reflection of light by the p-electrode has great affects on the light output efficiency. In other words, the light output efficiency can be improved by the p-electrode 22 having a high reflectivity in a wavelength range of light from the AlGaN light generation layer 18. The light generation layer 18 emits the first and second components of light. The first component is emitted toward the surface of the light emitting diode 1 on which the n-electrode 28 is provided. The second component is emitted toward the Cu—W substrate 26.

If the reflectivity of the p-electrode 22 is higher than that of the Cu—W substrate 26 in the wavelength range of light from the AlGaN layer 18, most of the second component is reflected by the p-electrode 22 and the first and reflected components are emitted through the side of the light emitting diode 1 on which the n-electrode 28 is provided. If the reflectivity of the p-electrode 22 is lower than that of the Cu—W substrate 26 in the above wavelength range, most of the second component is absorbed by the p-electrode 22.

Consequently, if the p-electrode 22 is made of material that has a reflectivity higher than the Cu—W substrate 26, such as Ag, the light emitting diode 1 exhibits an excellent efficiency of light output.

A semiconductor layer for lifting-off is made of material having a bandgap smaller than material of the substrate, such as InGaN semiconductor. The InGaN layer is formed on a substrate made of GaN-based material, such as a GaN substrate. The InGaN layer 14 receives a laser beam of the peak wavelength smaller than a wavelength corresponding to the bandgap energy of InGaN and greater than a wavelength corresponding to the bandgap energy of GaN semiconductor, such as a laser beam of wavelength, 400 nanometers. The irradiation of the laser beam permits the separation of one of the GaN substrate 10 and the AlGaN layers 16, 18 and 20 from the other by a lift-off method. Further, due to the property of nitride-based compound semiconductor containing indium, the InGaN 14 works as a buffer layer for reducing stresses in the layers grown thereon. Specifically, the InGaN 14 permits the deposition of the thick AlGaN layers 16, 18 and 20 on the GaN substrate having a lattice constant that is not equal to lattice constants of the above AlGaN layers, and the thick AlGaN layers can enhance the confinement of carriers which affects the generation of light in the light emitting diode 1.

Figure 16:
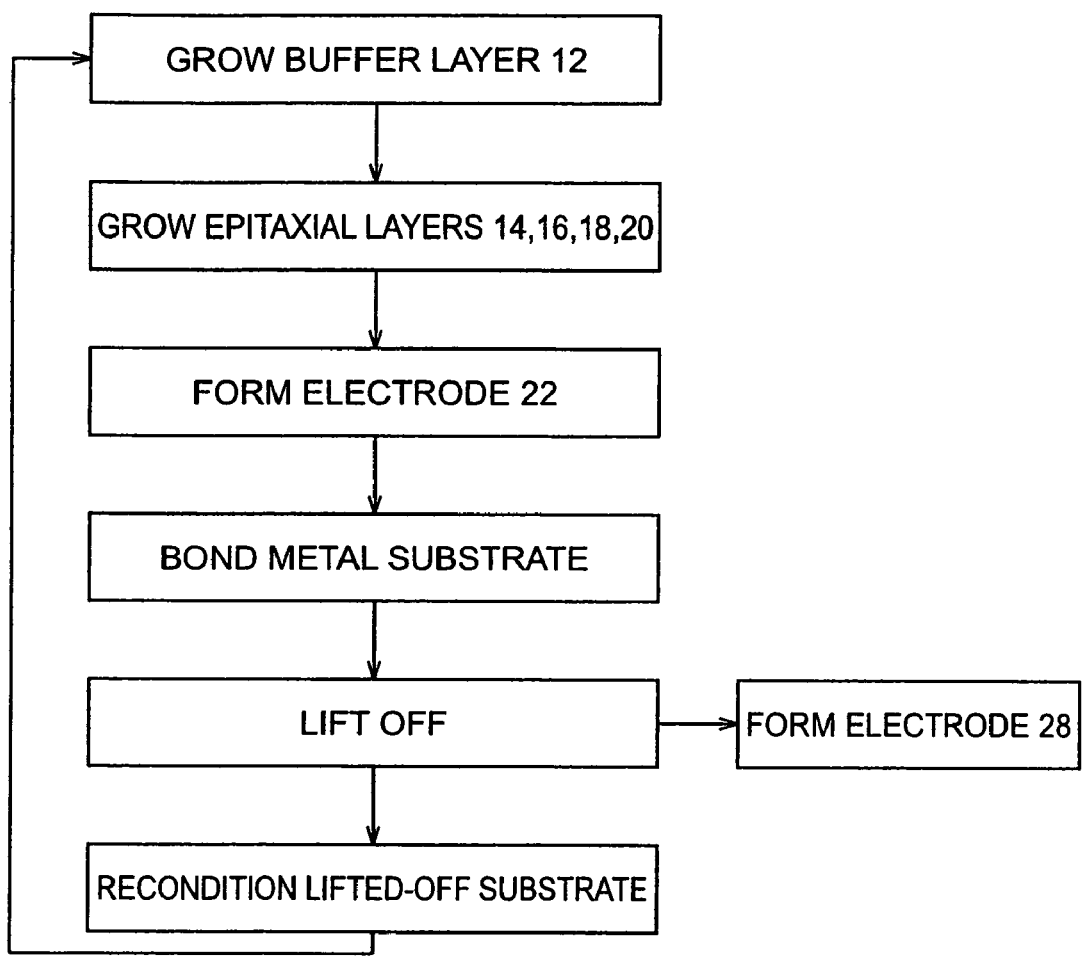
FIG. 16 is a flowchart showing the recycle of the semiconductor substrate.

As shown in FIG. 16, after the GaN substrate is lifted off, the surface of the lifted-off GaN substrate is polished to restore or recondition the surface for reusing the GaN substrate to make light emitting diodes. The reuse of the GaN substrate reduces the manufacturing cost of the light emitting diode 1.

Subsequently, the light emitting diode 1 as above will be described. The semiconductor light generating device, such as the light emitting diode 1, includes a GaN-based semiconductor portion, an electrode and a conductive substrate. The GaN-based semiconductor portion includes a light generating layer. The light generating layer has a density of threading dislocations smaller than $1 \times 10^7$ per square centimeters ($cm^{-2}$). The electrode is provided on the GaN-based semiconductor portion. The primary surface of the conductive substrate is bonded to the surface of the electrode by a conductive adhesive. Preferably, the dimension of the primary surface of the conductive substrate is substantially equal to the dimension of the surface of the electrode. The thickness of the GaN-based semiconductor portion is smaller than that of the conductive substrate, and may be 10 micrometers at a maximum.

Since the light generating layer 18 is made of AlGaN the bandgap of which is greater than that of InGaN, the light emitting diode 1 can generate light of a peak wavelength, e.g., 350 nanometers, in an ultraviolet range and this wavelength is shorter than that of another light emitting diode having an InGaN light generation layer. Semiconductor light generating devices having one or more layers of AlGaN or nitride-based compound semiconductor containing aluminum are sensitive to threading dislocations as compared to a semiconductor light generating devices having one or more layers of InGaN, and the threading dislocations in the former device deteriorates the light generating efficiency as compared to the latter device.

Diligent studies conducted by the inventors have found a solution: a method of manufacturing a light emitting diode using a GaN substrate, as described above. This light emitting diode has a light generating efficiency improved by lowering the density of threading dislocations using a substrate of GaN semiconductor having a lattice constant close to that of AlGaN as compared to sapphire. The density of threading dislocations of the AlGaN light generating layer 18 is equal to or less than $5 \times 10^6$ per square centimeters ($cm^{-2}$) in the light emitting diode 1 fabricated by the above method, and this value is less than $1.0 \times 10^7$ per square centimeters ($cm^{-2}$). In GaN-based light emitting diodes, particularly to GaN-based ultraviolet light emitting diodes, threading dislocations in the light generating layers work as nonluminous recombination centers, and thus a light emitting diode that includes a light generating layer with a low density of threading dislocations has an excellent efficiency of light generation. In one example, a light emitting diode generates ultraviolet light of a power of 100 milliwatts and the peak wavelength of 350 nanometers at the current of 500 milliamperes.

The light emitting diode 1 is fabricated by both the removal of the GaN substrate using the laser lift-off method and the bonding of the conductive substrate, and thus provides the light from the AlGaN light generating layer 18 in a high efficiency of light output without any absorption of the light by the GaN substrate.

As described above in detail, the layers 16, 18 and 20 are formed on the GaN substrate of a lattice constant close to that of AlGaN and thus the densities of threading dislocations in the AlGaN layers 16, 18 and 20 are reduced as compared to AlGaN layers grown on a sapphire substrate. Accordingly, the light emitting diode 1 has a high efficiency of light generation. Au—Sn solder layer 24 which bonds the p-electrode 22 and the Cu—W alloy substrate 26 to each other has a small thermal resistance, and thus the light emitting diode 1 has a high optical power efficiency even in the high injection of current.

Second Embodiment

With reference to FIGS. 7 to 12, a method of making a semiconductor light generating device 1A according to the second embodiment of the present invention will be described below.

Figure 7:
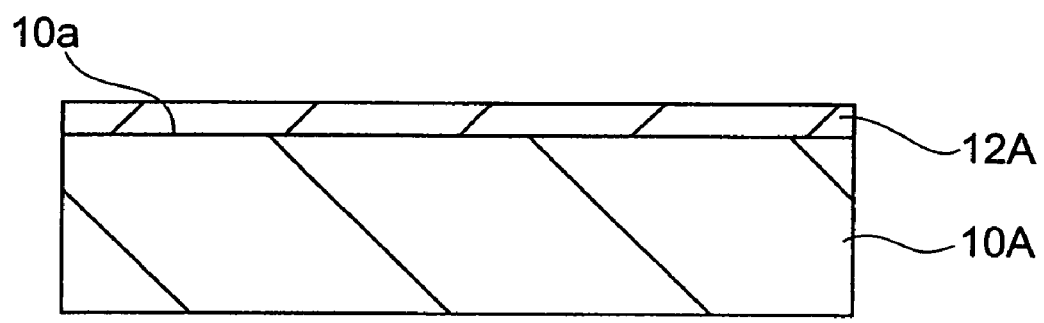
FIG. 7 is a view showing the formation of a buffer layer on an AlGaN substrate.

A substrate 10A of single crystal $Al_VGa_{1-V}N$ ($0<V\leq1$) is prepared. For example, the composition V of the substrate 10A is 0.18. The $Al_VGa_{1-V}N$ substrate 10A is placed in an MOCVD apparatus to perform the thermal cleaning process of the $Al_VGa_{1-V}N$ substrate 10A as is the GaN substrate in the first embodiment. For example, the temperature of the thermal cleaning process is 1050 degrees Celsius. At the same temperature as the thermal cleaning process, a gas including TMA and TMG of III group element sources, $NH_3$ of a V group element source and $SiH_4$ of a doping element source are supplied to the MOCVD apparatus to form an n-type $Al_WGa_{1-W}N$ buffer layer 12A ($0<W<1$) on the surface 10a of the $Al_VGa_{1-V}N$ substrate 10A, as shown in FIG. 7. For example, the epitaxial growth temperature is 1050 degrees Celsius. For example, the composition W of the $Al_WGa_{1-W}N$ buffer layer 12A is 0.18 and the thickness is 0.5 micrometers.

Figure 8:
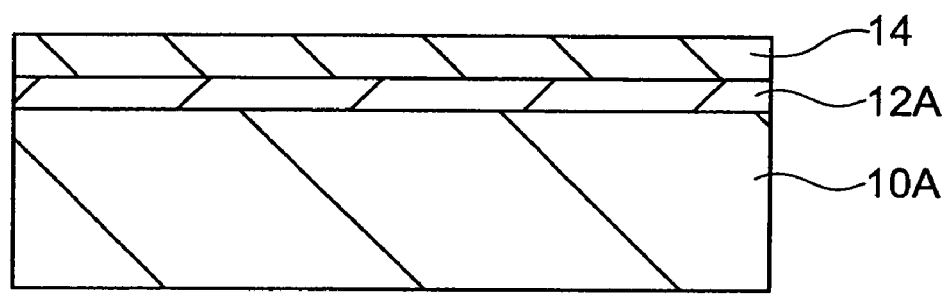
FIG. 8 is a view showing the formation of a InGaN layer on the buffer layer.

The temperature of the substrate 10A is decreased to 800 degrees Celsius, and a gas including TMG and TMI of III group element sources and $NH_3$ of a V group element source are supplied to the MOCVD apparatus to form a $In_XGa_{1-X}N$ layer 14 on the $Al_WGa_{1-W}N$ buffer layer 12A, as shown in FIG. 8. For example, the composition X of the $In_XGa_{1-X}N$ layer 14 is 0.1 and the thickness of the $In_XGa_{1-X}N$ layer 14 is 0.1 micrometers.

Figure 9:
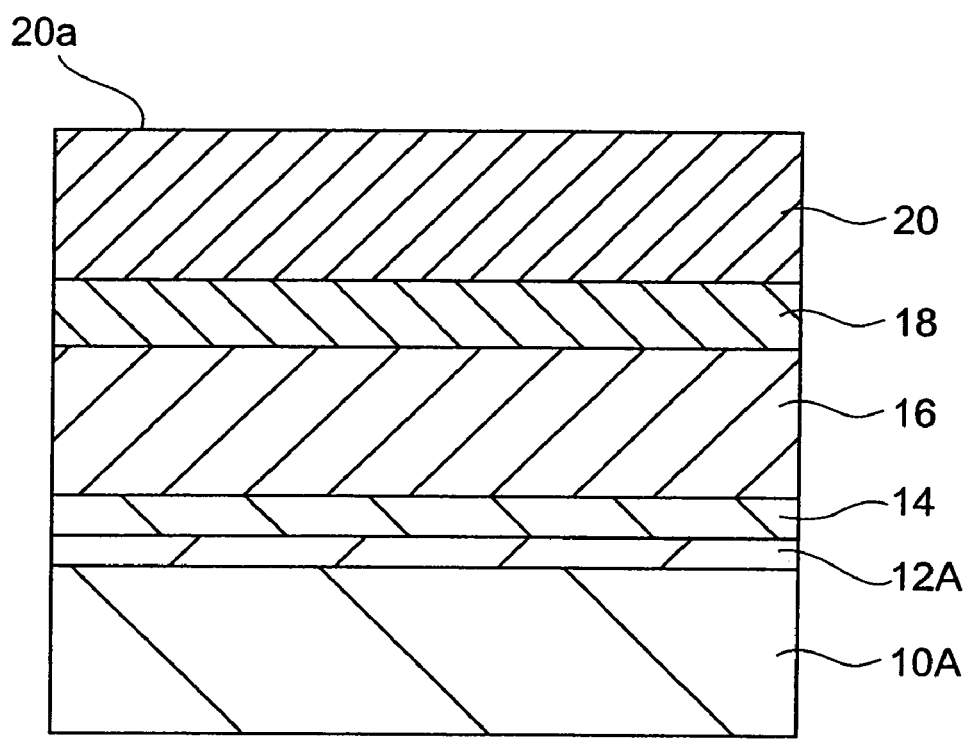
FIG. 9 is a view showing the formation of AlGaN layers on the InGaN sacrificial layer.

The temperature of the substrate 10A is increased to 1100 degrees Celsius, and a gas including TMG and TMA of III group element sources, $NH_3$ of a V group element source and $SiH_4$ of a doping element source are supplied to the MOCVD apparatus to form an n-type $Al_YGa_{1-Y}N$ layer 16 on the InGaN layer 14, as shown in FIG. 9. For example, the composition Y of the n-type $Al_YGa_{1-Y}N$ layer 16 is 0.1 and the thickness of $Al_YGa_{1-Y}N$ layer 16 is 0.2 micrometers. Then, a gas including TMG and TMA of III group element sources, $NH_3$ of a V group element source and $SiH_4$ of a doping element source are supplied to the MOCVD apparatus to form an $Al_ZGa_{1-Z}N$ light generating layer 18 on the AlGaN layer 16, as shown in FIG. 9. For example, the growth temperature is the same temperature as that of the n-type $Al_YGa_{1-Y}N$ layer 16. For example, the composition Z of the n-type $Al_ZGa_{1-Z}N$ layer 18 is 0.05 and the thickness of the $Al_ZGa_{1-Z}N$ layer 18 is 0.1 micrometers. Without changing the substrate temperature, a gas including TMG and TMA of III group element sources, $NH_3$ of a V group element source and $Cp_2Mg$ of a doping element source are supplied to the MOCVD apparatus to form a p-type $Al_UGa_{1-U}N$ layer 20 on the light generating AlGaN layer 18, as shown in FIG. 9. For example, the composition U of the $Al_UGa_{1-U}N$ layer 20 is 0.1 and the thickness of the $Al_UGa_{1-U}N$ layer 20 is 0.2 micrometers. As descried above, a GaN-based semiconductor structure, such as an AlGaN semiconductor structure including the AlGaN layers 16, 18 and 20, is provided on the AlGaN substrate 10A, as shown in FIG. 9. The AlGaN buffer layer 12A and the InGaN layer 14 are located between the GaN-based semiconductor structure and the AlGaN substrate 10A.

Figure 10:
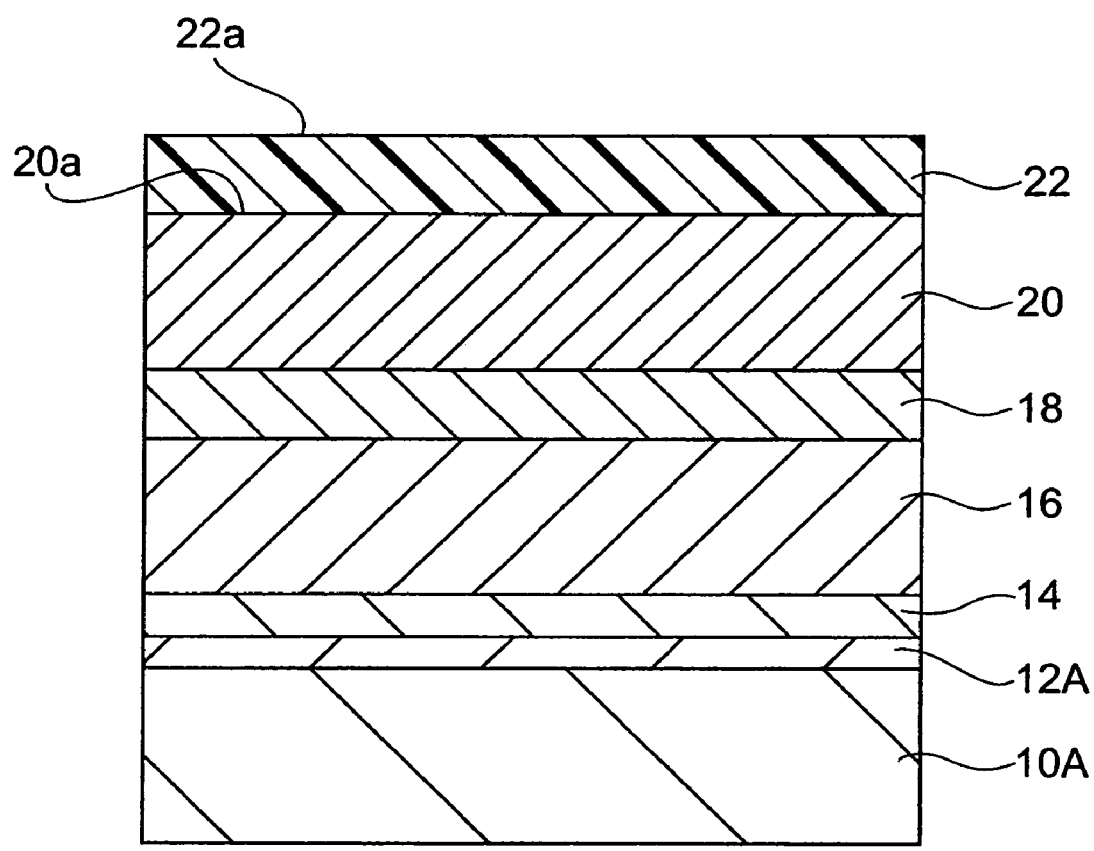
FIG. 10 is a view showing the formation of a p-electrode film on the GaN-based semiconductor layer.
Figure 11:
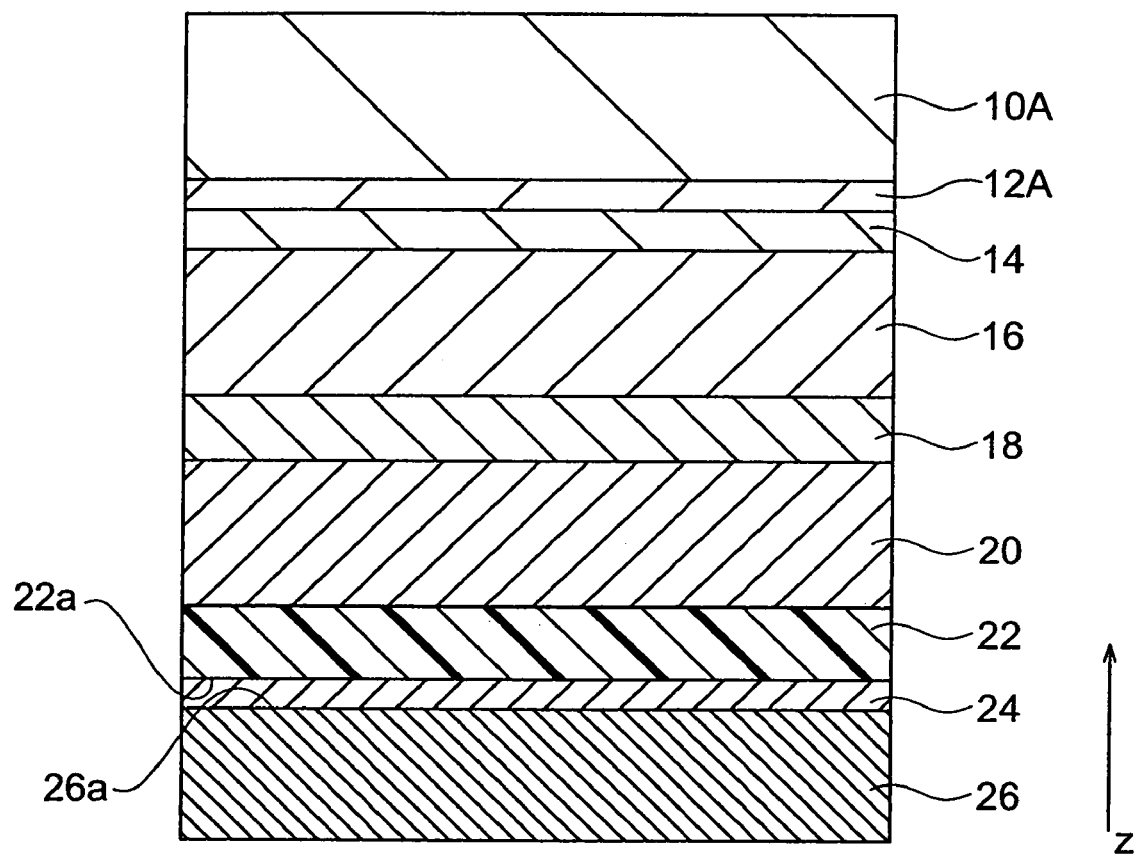
FIG. 11 is a view showing the bonding of the electrode film to a conductive substrate.

Thereafter, the AlGaN substrate 10A and the epitaxial layers 12A, 14, 16, 18 and 20 formed thereon (thereinafter referred to as the epitaxial substrate) is taken out from the MOCVD apparatus, and the epitaxial substrate is placed in the metal deposition apparatus and a p-electrode film 22 of Ag is deposited on the surface 20a of the p-type AlGaN layer 20, as shown in FIG. 10. The p-electrode film 22 is heated at the temperature of 400 degrees Celsius for five minutes. After the AlGaN substrate 10A with the p-electrode film 22 is taken out from the metal deposition apparatus, the p-electrode film 22 is bonded to a metal substrate, such as a Cu—W alloy substrate 26, by use of a conductive adhesive, such as a Au—Sn solder layer 24, as shown in FIG. 11. For example, the melt point of Au—Sn solder is 280 degrees Celsius. The surface 22a of the p-electrode film 22 is bonded to the surface 26a of the Cu—W alloy substrate 26. The semiconductor substrate and layers 10A, 12A, 14, 16, 18 and 20 and the Cu—W alloy substrate 26 are integrated with each other to form a single member.

Figure 12:
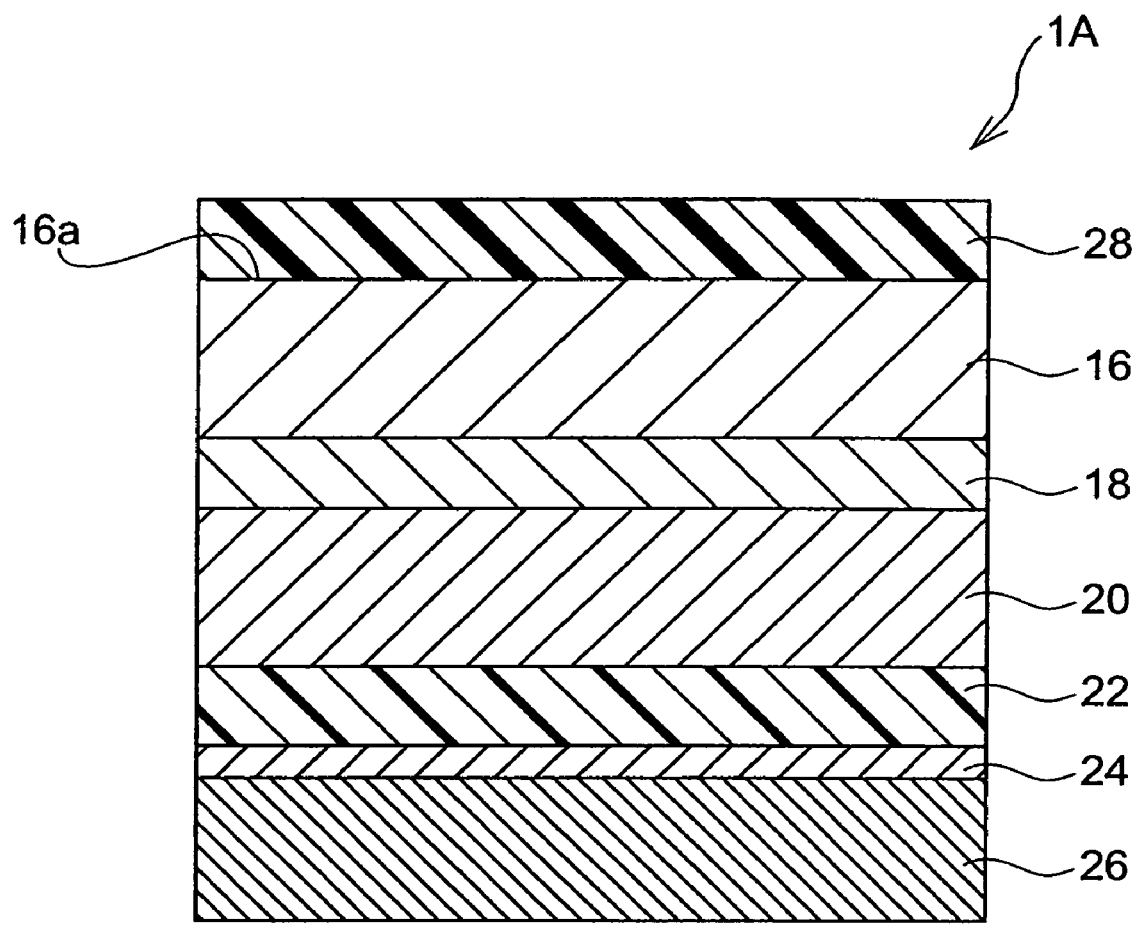
FIG. 12 is a view showing a light generating device.
Figure 15:
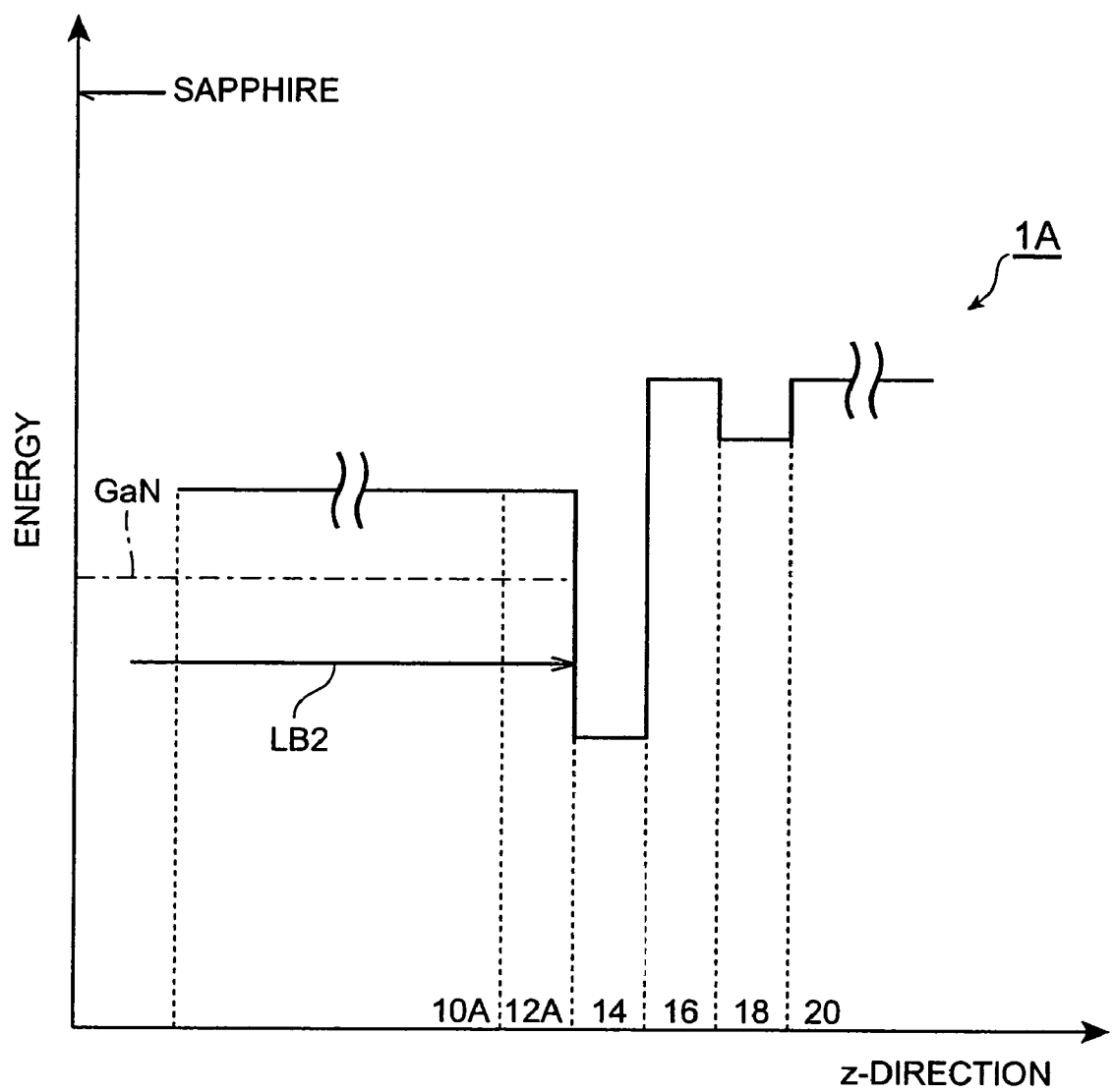
FIG. 15 is a view showing the irradiation of a laser beam to the substrate.

As shown in FIG. 15, laser beam LB2 having/a wavelength of 400 nanometers is irradiated to the backside of the AlGaN substrate 10A. The irradiated light passes through the AlGaN substrate 10A and is absorbed by the InGaN layer 14. This absorption of the laser beam modifies the InGaN layer 14 and the modified InGaN layer weakens bonding force between the InGaN layer 14 and the buffer layer 12A to separate one of the AlGaN substrate 10A and the InGaN layer 14 from the other. The surface exposed by this separation is polished to create the surface 16a of the n-type AlGaN layer 16. Then, an n-electrode 28 is formed on the polished surface 16a in a similar method to the above p-electrode. Thereafter, as shown in FIG. 14, the semiconductor layers 16, 18 and 20, p-electrode and conductive substrate are cut by dicing saw or the like to form semiconductor dies each of which is the light emitting diode 1A as shown in FIG. 12. As a result of the above steps, the light emitting diode 1A according to the first embodiment is fabricated.

As described above, after the Cu—W alloy substrate 26 is bonded to the AlGaN layers 16, 18 and 20, the AlGaN substrate 10A used to deposit the AlGaN layers 16, 18 and 20 is lifted off from the AlGaN layers 16, 18 and 20. The Cu—W alloy has a small thermal resistance and thus the Cu—W alloy substrate 26 prevents the optical power of the light emitting diode 1 from saturating in a high injection of current.

The p-electrode 22 is made of material that has a reflectivity higher than the Cu—W substrate 26, such as Ag, and thus the light emitting diode 1A exhibits an excellent efficiency of light output.

A semiconductor layer for lifting-off is made of material, such as InGaN, having a bandgap smaller than material of the semiconductor substrate. The InGaN layer is formed on a substrate made of a group III nitride material, such as an AlGaN substrate. The InGaN layer 14 receives a laser beam having a peak wavelength, for example, 400 nanometers, which is smaller than that corresponding to the bandgap energy of InGaN semiconductor and greater than a wavelength corresponding to the bandgap energy of GaN semiconductor. The irradiation of the laser beam permits the separation of one of the GaN substrate 10 and the AlGaN layers 16, 18 and 20 from the other by a lift-off method.

As shown in FIG. 16, after the AlGaN substrate 10A is lifted-off, the lifted-off AlGaN substrate 10A is polished to restore or recondition the surface thereof for reusing the AlGaN substrate 10A to make light emitting diodes. The reuse of the AlGaN substrate 10A reduces the manufacturing cost of the light emitting diode 1A.

Subsequently, the light emitting diode 1A as above will be described below. The semiconductor light generating device, such as the light emitting diode 1A, includes a GaN-based semiconductor portion, an electrode and a conductive substrate. The GaN-based semiconductor portion includes a light generating layer. The light generating layer has a density of threading dislocations smaller than $1 \times 10^7$ square centimeters ($cm^{-2}$). The electrode is provided on the GaN-based semiconductor portion. The primary surface of the conductive substrate is bonded to the surface of the electrode by a conductive adhesive. Preferably, the dimension of the primary surface of the conductive substrate is substantially equal to the dimension of the surface of the electrode. The thickness of the GaN-based semiconductor portion is smaller than that of the conductive substrate, and may be 10 micrometers at a maximum.

The light emitting diode 1A includes the light generating layer 18 as in light emitting diode 1. The light emitting diode 1A can generate light, for example, 350 nanometers, in an ultraviolet wavelength range (for example, 205 to 365 nanometers). The wavelength of this light is shorter than a wavelength of light generated by a light emitting diode having an InGaN light generating layer. The light emitting diode 1A, however, is sensitive to threading dislocations as compared to a semiconductor light generating devices having one or more layers of InGaN. Diligent studies conducted by the inventors have found a solution of a method of manufacturing a light emitting diode using an AlGaN substrate as described above. This light emitting diode has a light emitting efficiency improved by lowering the density of threading dislocations using a substrate of $Al_XG_{1-X}aN$ semiconductor (X=0.18) having a lattice constant approximately equal to that of the light generating $Al_ZGa_{1-Z}N$ layer 18 (Z=0.05). The density of threading dislocations of the AlGaN light generating layer 18 is about $1.0 \times 10^6$ per square centimeters ($cm^{-2}$) which is less than $1.0 \times 10^7$ per square centimeters ($cm^{-2}$).

In GaN-based light emitting diodes, particularly to ultraviolet light emitting diodes, threading dislocations in the light generating layers work as nonluminous recombination centers, and thus GaN-based light emitting diodes including a light generating layer with a low density of threading dislocations has an excellent efficiency of light generation. Such a light emitting diode generates ultraviolet light of 100 milliwatts power and the wavelength of 350 nanometers at the current of 500 milliamperes.

The light emitting diode is fabricated by both the removal of the AlGaN substrate using a laser lift-off method and the bonding of the conductive substrate, and thus emits light from the AlGaN light generating layer 18 in a high output efficiency without the absorption of the light by the GaN substrate.

As described above in detail, the layers 16, 18 and 20 are formed on the AlGaN substrate 10A of a lattice constant approximately equal or close to that of AlGaN, and thus the densities of threading dislocations in the AlGaN layers 16, 18 and 20 are reduced as compared to AlGaN layers grown on the sapphire substrate. Accordingly, the light emitting diode 1A has a high efficiency of light generation. The Au—Sn solder layer 24 which bonds the p-electrode 22 and the Cu—W alloy substrate 26 to each other has a small thermal resistance, and thus the light emitting diode 1A has a high efficiency of light generation even in the high injection of current.

The present invention is not limited to the above embodiments, and can be modified as follows. For example, GaN-based semiconductor layers are not limited to the AlGaN layers, but GaN-based mixed semiconductor crystal containing indium, aluminum and so on, for example AlInGaN. The material of the conductive substrate is not limited to Cu—W alloy, and metal having a low thermal resistance, such as Fe—Ni alloy, can be also used for the conductive substrate. The conductive adhesive is not limited to Au—Sn solder, but Pb—Sn solder can also be used as the conductive adhesive. The composition of the AlGaN substrate and InGaN layers can be changed if required.

The light generating device is limited to the light emitting diode and may be a laser diode. The separation of the GaN or AlGaN substrate from the GaN-based semiconductor layers is not limited to the laser lift-off method, and, for example, wet etching methods can be also used. The material of the p-electrode is not limited to silver (Ag), and conductive material which has a reflectively greater than that of the conductive substrate in the wavelength range of light from the light generating layer, aluminum (Al), rhodium (Rh) and so on can be also used.

A method of making a semiconductor device according to the present invention may include the steps of: forming GaN-based semiconductor layers including a light generating layer on the $Al_xGa_{1-x}N$ substrate; forming an electrode film on the GaN-based semiconductor layers; bonding the electrode film to a conductive substrate having a absorption coefficient lower than that of the $Al_xGa_{1-x}N$ substrate in the range of light from the light generation layer; separating the $Al_xGa_{1-x}N$ substrate from the GaN-based semiconductor layers. Cu—W alloy is shown as material that has a reflectivity and an optical absorption coefficient which are lower than those of GaN semiconductor.

Having described and illustrated the principle of the invention in a preferred embodiment thereof, it is appreciated by those having skill in the art that the invention can be modified in arrangement and detail without departing from such principles. We therefore claim all modifications and variations coming within the spirit and scope of the following claims.

What is claimed is:

1. A semiconductor light generating device comprising:
a GaN-based semiconductor portion including a light generating layer, the light generating layer having a density of threading dislocations smaller than $1 \times 10^7 cm^{-2}$;
an electrode provided on the GaN-based semiconductor portion;
a conductive substrate bonded to a surface of the electrode by a conductive adhesive.

2. The semiconductor light generating device according to claim 1, wherein the light generating layer is made of a GaN-based semiconductor having a bandgap energy greater than GaN semiconductor.

3. The semiconductor light generating device according to claim 1, wherein the light generating layer is made of a semiconductor material of a bandgap energy greater than $Al_xGa_{1-x}N$ ($0 < x \leq 1$).

4. The semiconductor light generating device according to claim 1, wherein the electrode is made of material having a reflectivity greater than the conductive substrate at a peak wavelength of light from the light generating layer.

5. The semiconductor light generating device according to claim 1, wherein the light generating layer is made of a nitride-based compound semiconductor containing aluminum.

* * * * *